(12) United States Patent
Masuda et al.

(10) Patent No.: US 9,184,353 B2
(45) Date of Patent: *Nov. 10, 2015

(54) LIGHT-EMITTING DEVICE (71) Applicant: SHARP KABUSHIKI KAISHA, Osaka (JP)

(72) Inventors: Masatsugu Masuda, Osaka (JP); Kenji Terashima, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/615,017

(22) Filed: Feb. 5, 2015

(65) Prior Publication Data

US 2015/0144959 A1   May 28, 2015

Related U.S. Application Data

(63) Continuation of application No. 14/470,153, filed on Aug. 27, 2014, now Pat. No. 8,981,639, which is a continuation of application No. 13/729,191, filed on Dec. 28, 2012, now Pat. No. 8,829,781, which is a (Continued)

(30) Foreign Application Priority Data

Mar. 3, 2008   (JP) ................................. 2008-052210

(51) Int. Cl.
*H01L 33/50* (2010.01)
*H01L 33/32* (2010.01)
(Continued)

(52) U.S. Cl.
CPC .......... *H01L 33/504* (2013.01); *C09K 11/0883* (2013.01); *C09K 11/7734* (2013.01);
(Continued)

(58) Field of Classification Search
CPC ........ H01L 33/504; H01L 33/56; H01L 33/32
See application file for complete search history.

(56) References Cited

U.S. PATENT DOCUMENTS 6,252,254 B1   6/2001   Soules et al.
7,833,436 B2   11/2010  Shimooka et al.
(Continued)

FOREIGN PATENT DOCUMENTS

CN   1289456 A   3/2001
EP   1 964 905   9/2008
(Continued)

OTHER PUBLICATIONS

Office Action dated Jan. 14, 2015, issued in connection with U.S. Appl. No. 14/176,442 (Hanamoto et al).
(Continued)

*Primary Examiner* — Elmito Breval
(74) *Attorney, Agent, or Firm* — Nixon & Vanderhye P.C.

(57) ABSTRACT

Disclosed is a light-emitting device (1) including a light-emitting element (2) emitting primary light, and a light converter (3) absorbing a part of the primary light emitted from the light-emitting element (2) and emitting secondary light having a longer wavelength than the primary light. The light converter (3) contains a green light-emitting phosphor (4) and a red light-emitting phosphor (5). The green light-emitting phosphor (4) is composed of at least one phosphor selected from a divalent europium-activated oxynitride phosphor substantially represented by the following formula: $Eu_aSi_bAl_cO_dN_e$ and a divalent europium-activated silicate phosphor substantially represented by the following formula: $2(Ba_{1-f-g}MI_fEu_g)O.SiO_2$, while the red light-emitting phosphor (5) is composed of at least one phosphor selected from tetravalent manganese-activated fluoro-tetravalent metalate phosphors substantially represented by the following formulae: $MII_2(MIII_{1-h}Mn_h)F_6$ and/or $MIV(MIII_{1-h}Mn_h)F_6$. Consequently, the light-emitting device (1) has excellent color gamut (NTSC ratio).

9 Claims, 4 Drawing Sheets

Related U.S. Application Data continuation of application No. 13/542,051, filed on Jul. 5, 2012, now Pat. No. 8,362,685, which is a continuation of application No. 12/920,516, filed as application No. PCT/JP2009/052051 on Feb. 6, 2009, now Pat. No. 8,237,348.

(51) Int. Cl.

| | | |
|---|---|---|
| *H01L 33/56* | (2010.01) | |
| *G02F 1/1335* | (2006.01) | |
| *C09K 11/08* | (2006.01) | |
| *C09K 11/77* | (2006.01) | |
| *H05B 33/14* | (2006.01) | |

(52) U.S. Cl.
CPC .............. *G02F1/1336* (2013.01); *H01L 33/32* (2013.01); *H01L 33/505* (2013.01); *H01L 33/507* (2013.01); *H01L 33/56* (2013.01); *H05B 33/14* (2013.01); *G02F 2001/133614* (2013.01); *H01L 33/502* (2013.01)

(56) References Cited

U.S. PATENT DOCUMENTS

| | | |
|---|---|---|
| 8,237,348 B2 | 8/2012 | Masuda et al. |
| 8,362,685 B2 | 1/2013 | Masuda et al. |
| 8,829,781 B2 | 9/2014 | Masuda et al. |
| 2004/0012027 A1 | 1/2004 | Keller et al. |
| 2005/0200271 A1 | 9/2005 | Juestel et al. |
| 2006/0158089 A1 | 7/2006 | Saito et al. |
| 2006/0169986 A1 | 8/2006 | Radkov et al. |
| 2006/0169998 A1 | 8/2006 | Radkov et al. |
| 2007/0012931 A1 | 1/2007 | Lee et al. |
| 2007/0108896 A1 | 5/2007 | Hirosaki |
| 2007/0114562 A1 | 5/2007 | Radkov et al. |
| 2007/0205712 A1 | 9/2007 | Radkov et al. |
| 2007/0215892 A1* | 9/2007 | Ishii et al. .......................... 257/98 |
| 2007/0252924 A1 | 11/2007 | Haga et al. |
| 2007/0259206 A1 | 11/2007 | Oshio |
| 2007/0291467 A1 | 12/2007 | Nagai et al. |
| 2009/0303694 A1 | 12/2009 | Roth et al. |
| 2011/0121234 A1 | 5/2011 | Hirosaki |
| 2012/0305844 A1 | 12/2012 | Emoto et al. |
| 2013/0214311 A1 | 8/2013 | Masuda et al. |
| 2014/0361332 A1 | 12/2014 | Masuda et al. |

FOREIGN PATENT DOCUMENTS

| | | |
|---|---|---|
| JP | 2003-121838 | 4/2003 |
| JP | 2004-056109 A | 2/2004 |
| JP | 2004-287323 | 10/2004 |
| JP | 2006-049799 A | 2/2006 |
| JP | 2006-083219 A | 3/2006 |
| JP | 2006-106437 A | 4/2006 |
| JP | 2006-165266 A | 6/2006 |
| JP | 2006-261600 A | 9/2006 |
| JP | 2006-524425 | 10/2006 |
| JP | 2007-027421 A | 2/2007 |
| JP | 2007-088300 A | 4/2007 |
| JP | 2007-169452 A | 7/2007 |
| JP | 2007-180483 | 7/2007 |
| JP | 2007-227928 A | 9/2007 |
| JP | 2008-21868 | 1/2008 |
| JP | 2008-505433 A | 2/2008 |
| JP | 2009-532856 A | 9/2009 |
| JP | 2009-280763 | 12/2009 |
| KR | 10-2007-0098194 A | 10/2007 |
| WO | WO 2004/097949 | 11/2004 |
| WO | WO 2007/066733 | 6/2007 |
| WO | WO 2007/066733 A1 | 6/2007 |
| WO | WO2007/100824 | 9/2007 |
| WO | WO 2007/100824 A1 | 9/2007 |

OTHER PUBLICATIONS

Office Action dated Oct. 30, 2014, issued in connection with U.S. Appl. No. 14/176,442 (Hanamoto et al).
Office Action dated Apr. 17, 2014 from U.S. Appl. No. 13/263,053.
Office Action dated Apr. 28, 2014 from U.S. Appl. No. 14/176,442.
Notice of Allowance mailed Dec. 13, 2013, issued in connection with related U.S. Appl. No. 13/500,803, Determination of Patent Term Adjustment dated Dec. 13, 2013 mailed in U.S. Appl. No. 13/500,803, Notice of Allowability mailed in U.S. Appl. No. 13/500,803.
Notice of Allowance dated Nov. 19, 2013, issued in connection with related U.S. Appl. No. 13/303,907.
Notice of Allowance mailed Oct. 17, 2013, issued in connection with related U.S. Appl. No. 11/944,052, Determination of Patent Term Adjustment dated Oct. 17, 2013 mailed in U.S. Appl. No. 11/944,052, Notice of Allowability mailed in U.S. Appl. No. 11/944,052, Notice of References in U.S. Appl. No. 11/944,052, with Notice of Allowance, Examiner initialed Information Disclosure Statement in U.S. Appl. No. 11/944,052, bearing receipt date "Aug. 5, 2013", Identification of Copending Application(s) in U.S. Appl. No. 11/944,052, bearing receipt date "Aug. 5, 2013" and Examiner's initials.
Office Action issued in U.S. Appl. No. 11/944,052 dated Apr. 5, 2013.
International Search Report issued in PCT/JP2009/052051, mailed Mar. 3, 2009.
Office Action dated Feb. 27, 2015, issued in connection with U.S. Appl. No. 14/176,442 (Hanamoto).
Office Action dated Apr. 9, 2015, issued in connection with related U.S. Appl. No. 14/166,231.
U.S. Office Action mailed Jul. 31, 2015, issued in connection with U.S. Appl. No. 14/176,442.
Dictionary of Physics (Third Edition), edited by Dictionary of Physics Editing Committee, Sep. 30, 2005, published by Baifukan Co., Ltd., English translation of bibliographic information and relevant portion (5 pages).

* cited by examiner

FIG.8  PRIOR ART ly applied. More specifically, in the $MgGa_2O_4:Mn$, $Zn_2SiO_4:Mn$ described in the example of Patent document 1, its luminous efficiency is significantly low with excitation light ranging from 430 to 480 nm.

LIGHT-EMITTING DEVICE

This application is a continuation of U.S. patent application Ser. No. 14/470,153 (published as US 2014-0361332 A1), filed Aug. 27, 2014 (issued as U.S. Pat. No. 8,981,639), which is a continuation of U.S. patent application Ser. No. 13/729,191 (published as US 2013-0214311 A1, issued as U.S. Pat. No. 8,829,781), filed Dec. 28, 2012, which is a continuation of U.S. patent application Ser. No. 13/542,051, filed Jul. 5, 2012 (issued as U.S. Pat. No. 8,362,685), which is a continuation of U.S. patent application Ser. No. 12/920,516, filed Sep. 1, 2010 (issued as U.S. Pat. No. 8,237,348), which is the U.S. national phase of International Application No. PCT/JP2009/052051 filed Feb. 6, 2009, which claims priority to Japanese Application No. Application No. 2008-052210, filed Mar. 3, 2008, the entire contents of each of which are hereby incorporated by reference.

TECHNICAL FIELD

The present invention relates to a light-emitting device including a light-emitting element emitting primary light, and a light converter absorbing a part of the primary light emitted from the light-emitting element and emitting secondary light having a longer wavelength than the primary light.

BACKGROUND ART

A light-emitting device having a combination of a semiconductor light-emitting element and a phosphor attracts attention as a next-generation light-emitting device where low energy consumption, compact size, high brightness and wide color gamut are expected, and is actively researched and developed. As the primary light emitted from a light-emitting element, the light having a wavelength in a long wavelength UV to blue region, namely, 380 to 480 nm is usually used. Also proposed is a light converter using various phosphors suited for this application.

Further, in recent years, development of a backlight for a small-sized liquid crystal display (hereinafter, LCD (Liquid Crystal Display)) becomes more competitive. In this field, various methods are proposed, however, a method satisfying both brightness and color gamut (NTSC ratio) has not been found yet.

Currently, as a white light-emitting device, a combination of a blue light-emitting element (peak wavelength: about 450 nm), and a $(Y, Gd)_3(Al, Ga)_5O_{12}$ phosphor activated with trivalent cerium that is excited by the blue light and exhibits yellow light emission or a $(Sr,Ba,Ca)_2SiO_4$ phosphor activated with divalent europium is mainly used. However, in such a light-emitting device, color gamut (NTSC ratio) is about 65% (CIE1931). On the other hand, in recent years, even in a small-sized LCD, more excellent color gamut is demanded. Under such a background, it is an urgent need to improve the color gamut (NTSC ratio) of a backlight for a small-sized LCD.

For example, Japanese Patent Laying-Open No. 2003-121838 (Patent document 1) focuses on color gamut (NTSC ratio) in LCD. Patent document 1 describes that a backlight light source has a spectrum peak within the range of 505 to 535 nm, and an activator of a green phosphor used for the light source contains either europium, tungsten, tin, antimony or manganese, and also describes that $MgGa_2O_4:Mn$, $Zn_2SiO_4$: Mn is used as a green phosphor in an example. However, when the peak wavelength of the light-emitting element falls within the range of 430 to 480 nm, the phosphor containing either europium, tungsten, tin, antimony or manganese is not entirely applied. More specifically, in the $MgGa_2O_4:Mn$, $Zn_2SiO_4:Mn$ described in the example of Patent document 1, its luminous efficiency is significantly low with excitation light ranging from 430 to 480 nm.

Further, for example, Japanese Patent Laying-Open No. 2004-287323 (Patent document 2) describes, in addition to a RGB-LED where a red LED chip, a green LED chip and a blue LED chip form one package, a three band fluorescent lamp, a UV light LED+RGB phosphor, an organic EL light source and so on. However, Patent document 2 lacks concrete description concerning a RG phosphor that uses blue light as an excitation source.

On the other hand, a tetravalent manganese-activated fluoro-metalate phosphor is described, for example, in US20060169998A1 (Patent document 3). However, Patent document 3 does not describe a combination with a green phosphor of high efficiency and its high color gamut (NTSC ratio).

Patent document 1: Japanese Patent Laying-Open No. 2003-121838
Patent document 2: Japanese Patent Laying-Open No. 2004-287323
Patent document 3: US20060169998A1

DISCLOSURE OF THE INVENTION

Problems to be Solved by the Invention

The present invention has been made to solve the above problem, and it is an object of the present invention to provide a light-emitting device having excellent color gamut (NTSC ratio) by using a specific phosphor that emits light at high efficiency with light ranging from 430 to 480 nm from a light-emitting element.

Means for Solving the Problems

A light-emitting device according to the present invention is a light-emitting device including a light-emitting element emitting primary light, and a light converter absorbing a part of the primary light emitted from the light-emitting element and emitting secondary light having a longer wavelength than the primary light, the light converter including a green light-emitting phosphor and a red light-emitting phosphor, the green light-emitting phosphor including at least one selected from:
 a divalent europium-activated oxynitride phosphor which is β-type SiAlON, substantially represented by a general formula (A): $Eu_aSi_bAl_cO_dN_e$ (in general formula (A), $0.005 \le a \le 0.4$, $b+c=12$, and $d+e=16$), and
 a divalent europium-activated silicate phosphor substantially represented by a general formula (B): $2(Ba_{1-f-g}MI_fEu_g)O \cdot SiO_2$ (in general formula (B), MI represents at least one alkaline earth metal element selected from Mg, Ca and Sr, $0<f \le 0.55$, and $0.03 \le g \le 0.10$), the red light-emitting phosphor including at least one selected from:
 a tetravalent manganese-activated fluoro-tetravalent metalate phosphor substantially represented by a general formula (C): $MII_2(MIII_{1-h}Mn_h)F_6$ (in general formula (C), MII represents at least one alkaline metal element selected from Li, Na, K, Rb and Cs, MIII represents at least one tetravalent metal element selected from Ge, Si, Sn, Ti and Zr, and $0.001 \le h \le 0.1$), and
 a tetravalent manganese-activated fluoro-tetravalent metalate phosphor substantially represented by a general formula (D): $MIV(MIII_{1-h}Mn_h)F_6$ (in general formula (D), MIV represents at least one alkaline earth metal element selected from Mg, Ca, Sr, Ba and Zn, MIII represents at least one tetravalent metal element selected from Ge, Si, Sn, Ti and Zr, and 0.001≤h≤0.1).

It is here preferable that MII is K and MIII is Ti.

In the light-emitting device according to the present invention, it is preferable that 0.005≤h≤0.05.

In the light-emitting device according to the present invention, MI is preferably Sr.

In the light-emitting device according to the present invention, the light-emitting element is preferably a gallium nitride-based semiconductor emitting primary light having a peak wavelength of 430 to 480 nm.

Effects of the Invention

According to the present invention, there is provided a light-emitting device capable of obtaining white light having significantly excellent color gamut (NTSC ratio) while efficiently absorbing the light emitted from the light-emitting element in the light converter and emitting highly efficient white light.

DESCRIPTION OF THE REFERENCE SIGNS 1 light-emitting device, 2 light-emitting element, 3 light converter, 4 green light-emitting phosphor, 5 red light-emitting phosphor, 6 sealant

BEST MODES FOR CARRYING OUT THE INVENTION

Figure 1:
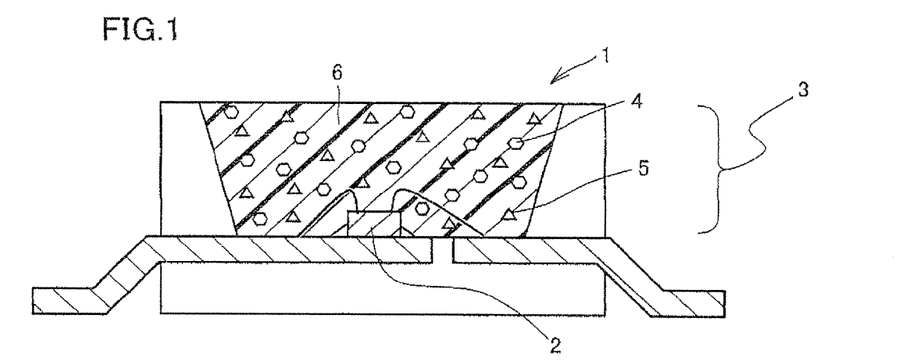
FIG. 1 is a cross section view schematically showing a light-emitting device 1 of a preferred example of the present invention.

FIG. 1 is a section view schematically showing a light-emitting device 1 of a preferred example of the present invention. As shown in FIG. 1, light-emitting device 1 of the present invention basically includes a light-emitting element 2 emitting primary light, and a light converter 3 absorbing a part of the primary light emitted from light-emitting element 2 and emitting secondary light having a wavelength longer than that of the primary light, and light converter 3 includes a green light-emitting phosphor 4 and a red light-emitting phosphor 5. FIG. 1 illustrates an example wherein light-emitting element 2, green light-emitting phosphor 4 and red light-emitting phosphor 5 are sealed in a sealant 6, so that light converter 3 is realized to be able to absorb a part of the primary light emitted from light-emitting element 2 and emit secondary light having a wavelength longer than that of the primary light. Light converter 3 in light-emitting device 1 of the present invention includes, as green light-emitting phosphor 4, at least one selected from the following (A) a divalent europium-activated oxynitride phosphor which is β-type SiAlON and (B) a divalent europium-activated silicate phosphor, and includes, as a red light-emitting phosphor, at least one selected from the following two (C) and (D) tetravalent manganese-activated fluoro-tetravalent metalate phosphors.

(A) Divalent Europium-Activated Oxynitride Green Light-Emitting Phosphor which is β-Type SiAlON The divalent europium-activated oxynitride green light-emitting phosphor is substantially represented by:

general formula (A):

(hereinafter, the divalent europium-activated oxynitride green light-emitting phosphor is referred to as "first green light-emitting phosphor"). In general formula (A), Eu represents europium, Si represents silicon, Al represents aluminum, O represents oxygen, and N represents nitrogen. In general formula (A), a value of "a" representing a composition ratio (concentration) of Eu is 0.005≤a≤0.4. When the value of "a" is less than 0.005, sufficient brightness is not obtained, whereas when the value of "a" exceeds 0.4, brightness largely decreases due to concentration quenching or the like. From the viewpoints of stability of powder characteristics and uniformity of matrix, the value of "a" in the above formula is preferably 0.01≤a≤0.2. In general formula (A), "b" that represents a composition ratio (concentration) of Si and "c" that represents a composition ratio (concentration) of Al satisfy b+c=12, and "d" that represents a composition ratio (concentration) of O and "e" that represents a composition ratio (concentration) of N satisfy d+e=16.

Concrete examples of the first green light-emitting phosphor include, but are not limited to, $Eu_{0.05}Si_{11.50}Al_{0.50}O_{0.05}N_{15.95}$, $Eu_{0.10}Si_{11.00}Al_{1.00}O_{0.10}N_{15.90}$, $Eu_{0.30}Si_{9.80}Al_{2.20}O_{0.30}N_{15.70}$, $Eu_{0.15}Si_{10.00}Al_{2.00}O_{0.20}N_{15.80}$, $Eu_{0.01}Si_{11.60}Al_{0.40}O_{0.01}N_{15.99}$, and $Eu_{0.005}Si_{11.70}Al_{0.30}O_{0.03}N_{15.97}$.

(B) Divalent Europium-Activated Silicate Phosphor

The divalent europium-activated silicate phosphor is substantially represented by:

general formula (B):

(hereinafter, the divalent europium-activated silicate phosphor is referred to as "second green light-emitting phosphor"). In general formula (B), Ba represents barium, Eu represents europium, O represents oxygen, and Si represents silicon. In general formula (B), MI represents at least one alkaline earth metal element selected from Mg, Ca and Sr, and for obtaining highly efficient matrix, MI is preferably Sr. In general formula (B), "f" that represents a composition ratio (concentration) of MI is 0<f≤0.55, and the value of "f" falling within this range makes it possible to obtain green light emission ranging from 510 to 540 nm. When the value of "f" exceeds 0.55, the green light emission is yellowish, and color purity is impaired. Further, from the viewpoints of efficiency and color purity, the value of "f" is preferably within the range of $0.15 \leq f \leq 0.45$. A value of "g" that represents a composition ratio (concentration) of Eu in general formula (B) is $0.03 \leq g \leq 0.10$. This is because when the value of "g" is less than 0.03, sufficient brightness is not obtained, and when the value of "g" exceeds 0.10, the brightness greatly decreases due to concentration quenching or the like. From the viewpoints of brightness and stability of powder characteristics, the value of "g" preferably falls within the range of $0.04 \leq g \leq 0.08$.

Concrete examples of the second green light-emitting phosphor include, but are not limited to, $2(Ba_{0.70}Sr_{0.26}Eu_{0.04}) \cdot SiO_2$, $2(Ba_{0.57}Sr_{0.38}Eu_{0.05})O \cdot SiO_2$, $2(Ba_{0.53}Sr_{0.43}Eu_{0.04})O \cdot SiO_2$, $2(Ba_{0.82}Sr_{0.15}Eu_{0.03})O \cdot SiO_2$, $2(Ba_{0.46}Sr_{0.49}Eu_{0.05})O \cdot SiO_2$, $2(Ba_{0.59}Sr_{0.35}Eu_{0.06})O \cdot SiO_2$, $2(Ba_{0.52}Sr_{0.40}Eu_{0.08})O \cdot SiO_2$, $2(Ba_{0.85}Sr_{0.10}Eu_{0.05})O \cdot SiO_2$, $2(Ba_{0.47}Sr_{0.50}Eu_{0.03})O \cdot SiO_2$, $2(Ba_{0.54}Sr_{0.36}Eu_{0.10})O \cdot SiO_2$, $2(Ba_{0.69}Sr_{0.25}Ca_{0.02}Eu_{0.04})O \cdot SiO_2$, $2(Ba_{0.56}Sr_{0.38}Mg_{0.01}Eu_{0.05})O \cdot SiO_2$, and $2(Ba_{0.81}Sr_{0.13}Mg_{0.01}Ca_{0.01}Eu_{0.04})O \cdot SiO_2$.

(C) Tetravalent Manganese-Activated Fluoro-Tetravalent Metalate Phosphor

The tetravalent manganese-activated fluoro-tetravalent metalate phosphor is substantially represented by:

$$MII_2(MIII_{1-h}Mn_h)F_6 \qquad \text{general formula (C):}$$

(hereinafter, the tetravalent manganese-activated fluoro-tetravalent metalate phosphor is referred to as "first red light-emitting phosphor"). In general formula (C), Mn represents manganese, and F represents fluorine. In general formula (C), MII represents at least one alkaline metal element selected from Na, K, Rb and Cs, and from the viewpoints of brightness and stability of powder characteristics, MII is preferably K. In general formula (C), MIII represents at least one tetravalent metal element selected from Ge, Si, Sn, Ti and Zr, and from the viewpoints of brightness and stability of powder characteristics, MIII is preferably Ti. In general formula (C), a value of "h" that represents a composition ratio (concentration) of Mn is $0.001 \leq h \leq 0.1$. This is because when the value of "h" is less than 0.001, a problem arises that sufficient brightness is not obtained, whereas when a value of "h" exceeds 0.1, a problem arises that the brightness greatly decreases due to concentration quenching or the like. From the viewpoints of brightness and stability of powder characteristics, the value of "h" is preferably $0.005 \leq h \leq 0.5$.

Concrete examples of the first red light-emitting phosphor include, but are not limited to, $K_2(Ti_{0.99}Mn_{0.01})F_6$, $K_2(Ti_{0.9}Mn_{0.1})F_6$, $K_2(Ti_{0.999}Mn_{0.001})F_6$, $Na_2(Zr_{0.98}Mn_{0.02})F_6$, $Cs_2(Si_{0.95}Mn_{0.05})F_6$, $Cs_2(Sn_{0.98}Mn_{0.02})F_6$, $K_2(Ti_{0.88}Zr_{0.10}Mn_{0.02})F_6$, $Na_2(Ti_{0.75}Sn_{0.20}Mn_{0.05})F_6$, $Cs_2(Ge_{0.999}Mn_{0.001})F_6$, and $(K_{0.80}Na_{0.20})_2(Ti_{0.69}Ge_{0.30}Mn_{0.01})F_6$.

(D) Tetravalent Manganese-Activated Fluoro-Tetravalent Metalate Phosphor

The tetravalent manganese-activated fluoro-tetravalent metalate phosphor is substantially represented by:

$$MIV(MIII_{1-h}Mn_h)F_6 \qquad \text{general formula (D):}$$

(hereinafter, the tetravalent manganese-activated fluoro-tetravalent metalate phosphor is referred to "second red light-emitting phosphor"). In general formula (D), Mn represents manganese, and F represents fluorine. In general formula (D), MIII represents, likewise the MIII in general formula (C), at least one tetravalent metal element selected from Ge, Si, Sn, Ti and Zr, and from the same reason, MIII is preferably Ti. In general formula (D), MIV represents at least one alkaline earth metal element selected from Mg, Ca, Sr, Ba and Zn, and from the viewpoints of brightness and stability of powder characteristics, MIV is preferably Ca. In general formula (D), a value of "h" that represents a composition ratio (concentration) of Mn is, likewise the "h" in general formula (C), $0.001 \leq h \leq 0.1$, and is preferably $0.005 \leq h \leq 0.5$ from the same reason.

Concrete examples of the second red light-emitting phosphor include, but are not limited to, $Zn(Ti_{0.98}Mn_{0.02})F_6$, $Ba(Zr_{0.995}Mn_{0.005})F_6$, $Ca(Ti_{0.995}Mn_{0.005})F_6$, and $Sr(Zr_{0.98}Mn_{0.02})F_6$.

Figure 2:
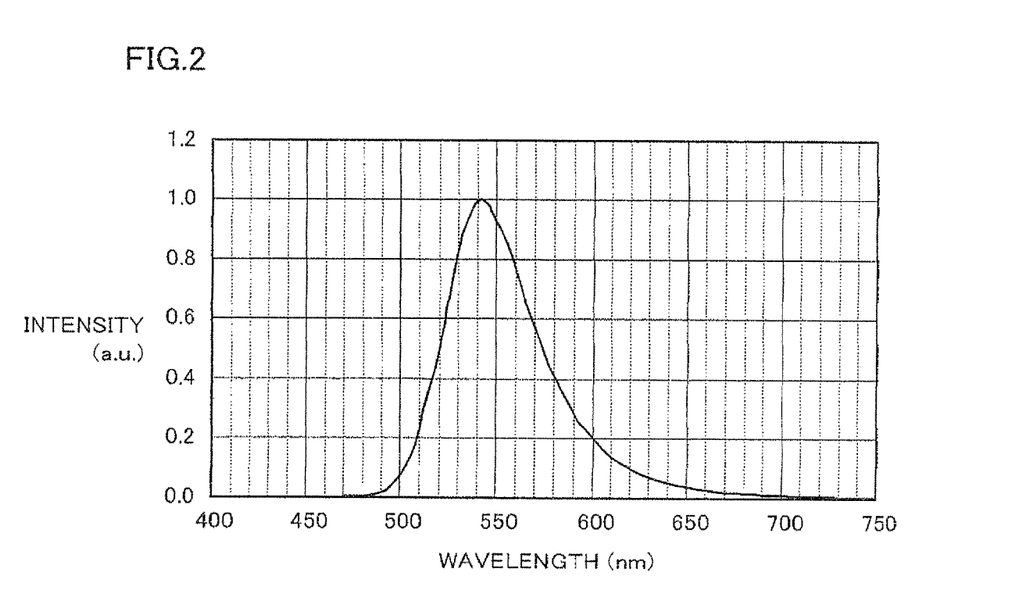
FIG. 2 is a graph showing a luminous spectrum distribution of one concrete example of a divalent europium-activated oxynitride green light-emitting phosphor which is a β-type SiAlON usable in a light-emitting device of the present invention.
Figure 3:
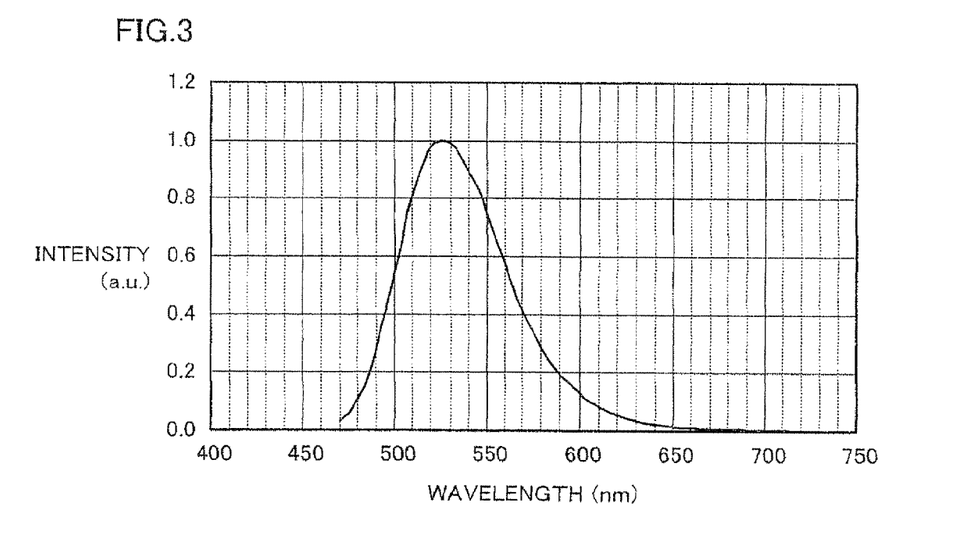
FIG. 3 is a graph showing a luminous spectrum distribution of one concrete example of a divalent europium-activated silicate phosphor usable in a light-emitting device of the present invention.
Figure 4:
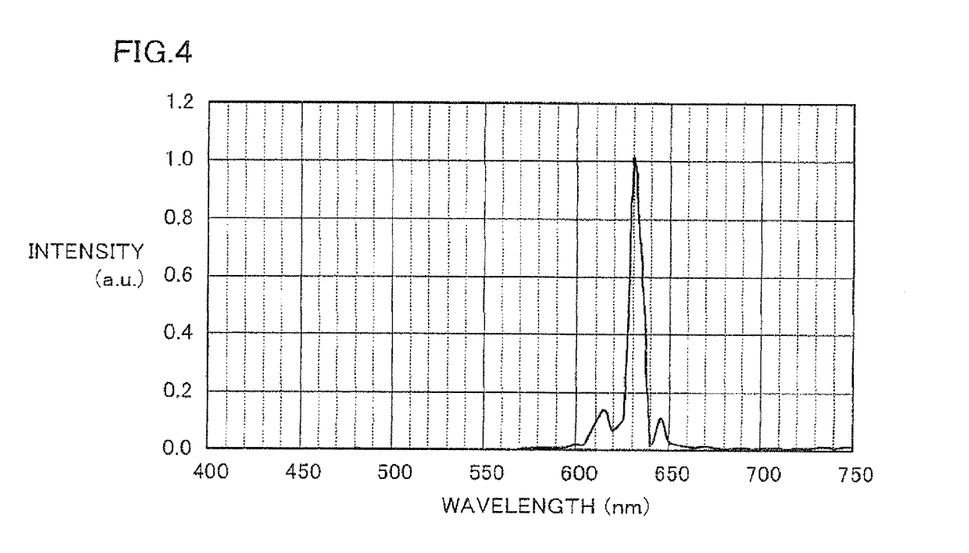
FIG. 4 is a graph showing a luminous spectrum distribution of one concrete example of a tetravalent manganese-activated fluoro-tetravalent metalate phosphor usable in a light-emitting device of the present invention.

The light converter in the light-emitting device of the present invention includes, as a green light-emitting phosphor, at least one selected from (A) divalent europium-activated activated oxynitride phosphor (first green light-emitting phosphor) which is β-type SiAlON and (B) divalent europium-activated silicate phosphor (second green light-emitting phosphor), and includes, as a red light-emitting phosphor, at least one selected from two kinds of (C) tetravalent manganese-activated fluoro-tetravalent metalate phosphor (first red light-emitting phosphor) and (D) tetravalent manganese-activated fluoro-tetravalent metalate phosphor (second red light-emitting phosphor). FIG. 2 shows a luminous spectrum distribution of a concrete example of a divalent europium-activated oxynitride green light-emitting phosphor which is a β-type SiAlON (concrete composition: $Eu_{0.05}Si_{11.50}Al_{0.50}O_{0.05}N_{15.95}$) usable in a light-emitting device of the present invention, FIG. 3 shows a luminous spectrum distribution of a concrete example of a divalent europium-activated silicate phosphor (concrete composition: $2(Ba_{0.70}Sr_{0.26}Eu_{0.04})O \cdot SiO_2$) usable in a light-emitting device of the present invention, and FIG. 4 shows a luminous spectrum distribution of a concrete example of a tetravalent manganese-activated fluoro-tetravalent metalate phosphor (concrete composition: $K_2(Ti_{0.99}Mn_{0.01})F_6$) usable in a light-emitting device of the present invention. Any luminous spectrums shown in FIG. 2 to FIG. 4 are results measured by using a fluorescent spectrophotometer at an excitation wavelength of 450 nm, and the vertical axis represents an intensity (arbitrary unit), and the horizontal axis represents a wavelength (nm).

In the light-emitting device of the present invention, a mixing ratio between the green light-emitting phosphor and the red light-emitting phosphor is not particularly limited, however, the green light-emitting phosphor is mixed preferably within the range of 5 to 70% by weight ratio, and more preferably within the range of 15 to 45% by weight ratio, relative to the red light-emitting phosphor.

Figure 5:
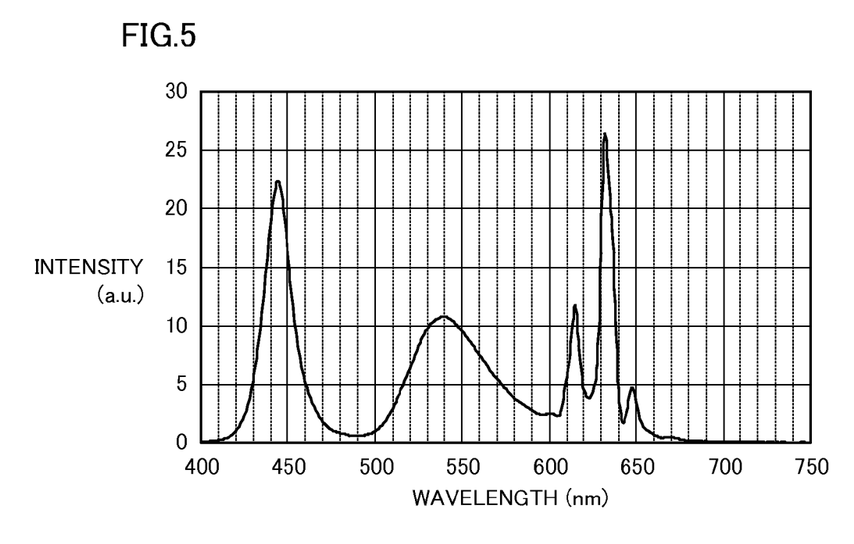
FIG. 5 is a graph showing a luminous spectrum distribution of a light-emitting device which is one preferred example of the present invention.
Figure 6:
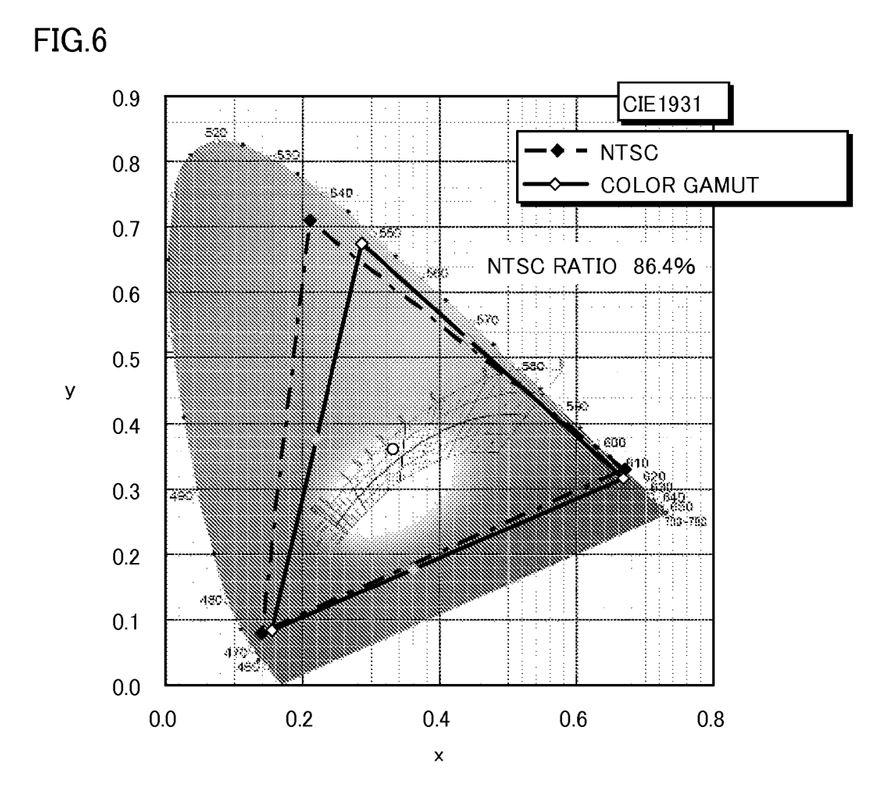
FIG. 6 is a chromaticity diagram showing color gamut of a LCD incorporating a light-emitting device which is one preferred example of the present invention as a backlight light source.
Figure 7:
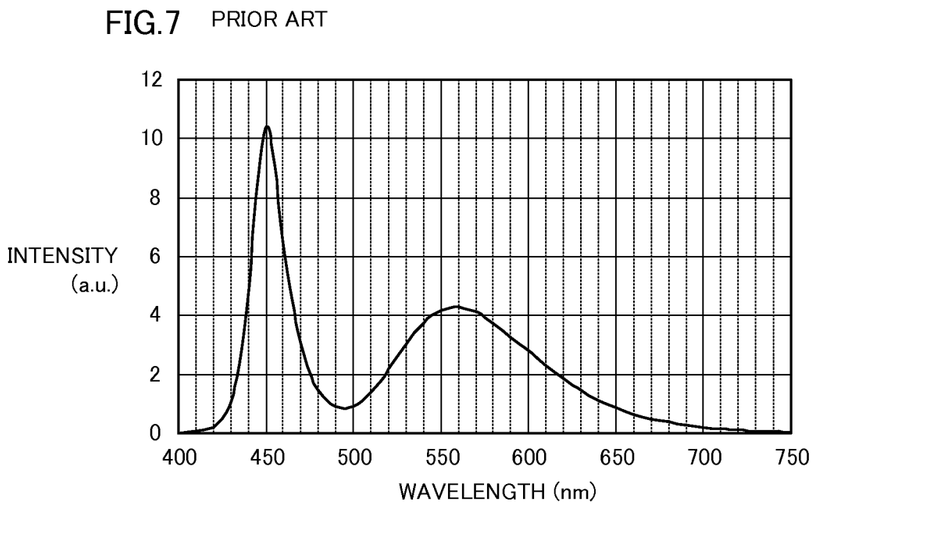
FIG. 7 is a graph showing a luminous spectrum distribution of a conventional light-emitting device using a yellow light-emitting phosphor.
Figure 8:
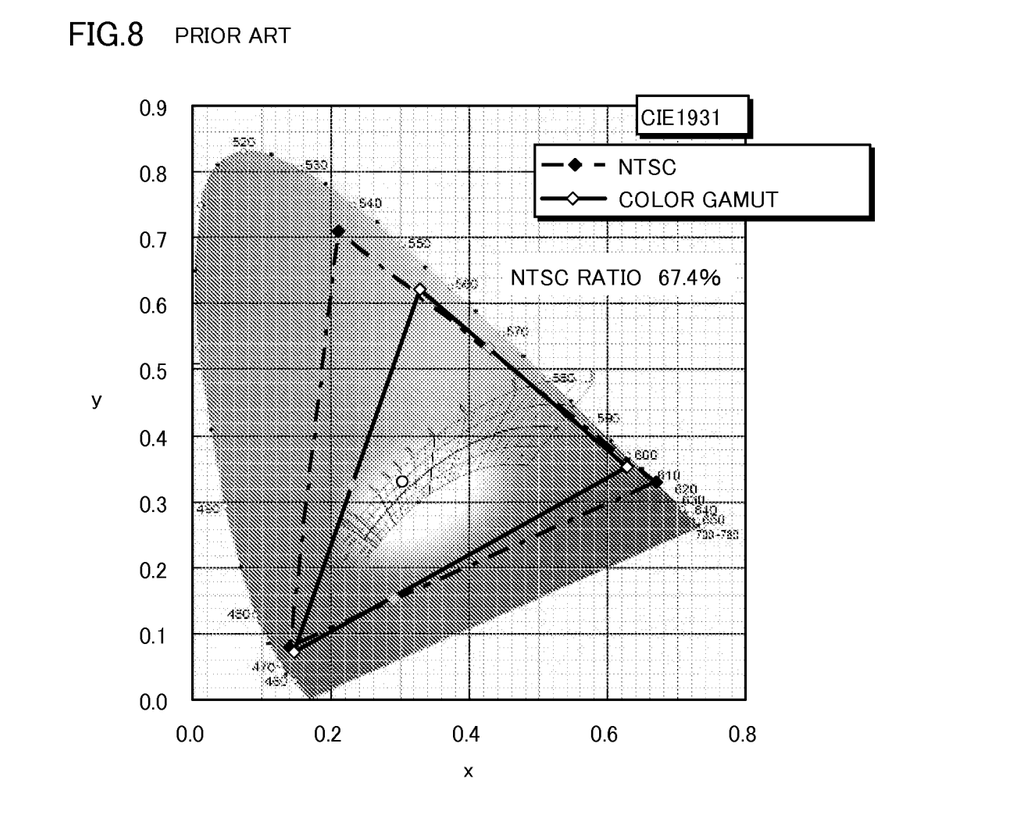
FIG. 8 is a chromaticity diagram showing color gamut of a LCD incorporating a conventional light-emitting device using a yellow light-emitting phosphor as a backlight light source.

FIG. 5 is a graph showing a luminous spectrum distribution of a light-emitting device of one preferred example of the present invention (light-emitting device fabricated in Example 1 as described later), and in FIG. 5, the vertical axis represents an intensity (arbitrary unit), and the horizontal axis represents a wavelength (nm). FIG. 6 is a chromaticity diagram (CIE1931) showing color gamut of a LCD incorporating a light-emitting device of one preferred example of the present invention (light-emitting device fabricated in Example 1 as described later) as a backlight light source. On the other hand, FIG. 7 is a graph showing a luminous spectrum distribution of a conventional light-emitting device using a yellow light-emitting phosphor (light-emitting device fabricated in Comparative example 1 as described later), and FIG. 8 is a chromaticity diagram (CIE1931) showing color gamut of a LCD incorporating the light-emitting device as a backlight light source. The luminous spectrum distribution of the light-emitting device shown in FIG. 5 and FIG. 7 is a result measured by using MCPD-2000 (available from OTSUKA ELECTRONICS CO., LTD.), and the color gamut shown in FIG. 6 and FIG. 8 is a result measured by using Bm5 (available from TOPCON CORPORATION). The results of FIG. 5 to FIG. 8 demonstrate that unlike the conventional light-emitting device, the light-emitting device of the present invention provides a light-emitting device capable of obtaining white light exhibiting significantly excellent color gamut (NTSC ratio) while efficiently absorbing light emitted from the light-emitting element in the light converter, and emitting highly efficient white light. NTSC ratio is a percentage relative to an area of triangle obtained by connecting chromaticity coordinates of red, green and blue, namely chromaticity coordinates (x, y) of red (0.670, 0.330), green (0.210, 0.710), and blue (0.140, 0.080) in a XYZ color system chromaticity diagram of red, green and blue defined by NTSC (National Television System Committee).

While the light-emitting element used in the light-emitting device of the present invention as described above is not particularly limited, a gallium nitride (GaN)-based semiconductor emitting primary light of the blue region having a peak wavelength ranging from 430 to 480 nm (more preferably 440 to 480 nm) is preferably used as a light-emitting element. When a light-emitting element having a peak wavelength of less than 430 nm is used, color rendering property is impaired because of decreased contribution of a blue light component, and practicality may be impaired. When a light-emitting element having a peak wavelength exceeding 480 nm is used, brightness in white decreases, so that practicality may be impaired.

Other configuration of the light-emitting device of the present invention is not particularly limited as far as the aforementioned features are realized. As sealant 6, a resin material having translucency, such as an epoxy resin, a silicone resin, and a urea resin, may be used unlimitatively. Of course, light converter 3 may contain an appropriate additive such as $SiO_2$, $TiO_2$, $ZrO_2$, $Al_2O_3$, and $Y_2O_3$ in addition to the phosphor and the sealant as far as the effect of the present invention is not hindered.

The green light-emitting phosphor and the red light-emitting phosphor for use in the light-emitting device of the present invention as described above are well known in the art, and may be produced by a conventionally known appropriate method, or are available as a commercial product.

In the following, the present invention will be more specifically described by way of Examples and Comparative examples, however, the present invention will not be limited thereto.

Example 1

Light-emitting device 1 of the example shown in FIG. 1 was fabricated in the following manner. As light-emitting element 2, a gallium nitride (GaN)-based semiconductor having a peak wavelength at 450 nm was used, and in light converter 3, $Eu_{0.05}Si_{11.50}Al_{0.50}O_{0.05}N_{15.95}$ (β-type SiAlON) was used as a green light-emitting phosphor, and $K_2(Ti_{0.99}Mn_{0.01})F_6$ was used as a red light-emitting phosphor. A 30:70 (weight ratio) mixture of these green light-emitting phosphor and red light-emitting phosphor was dispersed in a predetermined resin (ratio between a resin and a phosphor was 1.00:0.25) to fabricate a light converter. In this manner, a light-emitting device of Example 1 was fabricated.

Comparative Example 1

A light-emitting device was fabricated in a similar manner as Example 1 except that a yellow light-emitting phosphor represented by $(Y_{0.40}Gd_{0.45}Ce_{0.15})_3Al_5O_{12}$ was used in a light converter.

For the light-emitting devices obtained respectively in Example 1, and Comparative example 1, brightness, Tc-duv and color gamut (NTSC ratio) were evaluated. Brightness was determined by illuminating in a condition of a forward current (IF) of 20 mA, and converting white light from the light-emitting device into photocurrent. A value of Tc-duv was determined by illuminating in a condition of a forward current (IF) of 20 mA, measuring white light from the light-emitting device with MCPD-2000 (available from OTSUKA ELECTRONICS CO., LTD.). A value of color gamut (NTSC ratio) was determined by incorporating the fabricated light-emitting device as a backlight light source of a commercially available LCD TV display, and measuring by Bm5 available from TOPCON CORPORATION. The results are shown in Table 1.

TABLE 1

|  | Brightness (relative value) | Tc-duv | Color gamut (NTSC ratio) |
| --- | --- | --- | --- |
| Example 1 | 96.5% | 8700K + 0.002 | 88.3% |
| Comparative example 1 | 100.0% | 8700K + 0.002 | 70.1% |

Table 1 demonstrates that the light-emitting device of the present invention exhibits tremendously improved color gamut (NTSC ratio) compared with the conventional one, and has preferable characteristics as a backlight for a medium- or small-sized LCD.

Example 2

A light-emitting device was fabricated in a similar manner as Example 1 except that a gallium nitride (GaN)-based semiconductor having a peak wavelength at 440 nm was used as light-emitting element 2, $2(Ba_{0.70}Sr_{0.26}Eu_{0.04})O \cdot SiO_2$ was used as a green light-emitting phosphor, and $K_2(T_{0.995}Mn_{0.005})F_6$ was used as a red light-emitting phosphor.

Comparative Example 2

A light-emitting device was fabricated in a similar manner as Example 2 except that a yellow light-emitting phosphor represented by $(Y_{0.40}Gd_{0.50}Ce_{0.10})_3Al_5O_{12}$ was used in a light converter.

For the light-emitting devices obtained in Example 2 and Comparative example 2, brightness, Tc-duv and color gamut (NTSC ratio) were evaluated in a similar manner as the cases of the light-emitting devices of Example 1 and Comparative example 1 as described above. The results are shown in Table 2.

TABLE 2

|  | Brightness (relative value) | Tc-duv | Color gamut (NTSC ratio) |
| --- | --- | --- | --- |
| Example 2 | 96.1% | 7900K + 0.002 | 88.1% |
| Comparative example 2 | 100.0% | 7900K + 0.002 | 69.8% |

Table 2 demonstrates that the light-emitting device of the present invention exhibits tremendously improved color gamut (NTSC ratio) compared with the conventional one, and has preferable characteristics as a backlight for a medium- or small-sized LCD.

Examples 3 to 8

Comparative Examples 3 to 8

Light-emitting devices of Examples 3 to 8 and Comparative examples 3 to 8 were fabricated in a similar manner as Example 1 except that combinations of a peak wavelength of a light-emitting element and phosphors as shown in the following Table 3 were used respectively, and brightness, Tc-duv and color gamut (NTSC ratio) were evaluated in a similar manner as described above. Results are also shown in Table 3.

TABLE 3

| | Light-emitting element | Phosphor | Brightness (relative value) | Tc-duv | Color gamut (NTSC ratio) |
|---|---|---|---|---|---|
| Example 3 | 430 nm | Green: $Eu_{0.30}Si_{9.80}Al_{2.20}O_{0.30}N_{15.70}$<br>Red: $Na_2(Ti_{0.895}Zr_{0.100}Mn_{0.005})F_6$ | 96.6% | 9500K + 0.001 | 86.4% |
| Comparative example 3 | 430 nm | Yellow: $2(Sr_{0.92}Ba_{0.06}Eu_{0.02})O \cdot SiO_2$ | 100.0% | 9500K + 0.001 | 67.4% |
| Example 4 | 480 nm | Green: $Eu_{0.15}Si_{10.00}Al_{2.00}O_{0.20}N_{15.80}$<br>Red: $Cs_2(Ti_{0.79}Si_{0.20}Mn_{0.01})F_6$ | 96.0% | 8800K + 0.001 | 87.9% |
| Comparative example 4 | 480 nm | Yellow: $(Y_{0.40}Gd_{0.40}Ce_{0.20})_3Al_5O_{12}$ | 100.0% | 8800K + 0.001 | 70.0% |
| Example 5 | 455 nm | Green: $2(Ba_{0.82}Sr_{0.15}Eu_{0.03})O \cdot SiO_2$<br>Red: $Cs_2(Ti_{0.79}Si_{0.20}Mn_{0.01})F_6$ | 96.4% | 8900K + 0.002 | 88.0% |
| Comparative example 5 | 455 nm | Yellow: $(Y_{0.40}Gd_{0.45}Ce_{0.15})_3Al_5O_{12}$ | 100.0% | 8900K + 0.002 | 70.0% |
| Example 6 | 460 nm | Green: $Eu_{0.01}Si_{11.60}Al_{0.40}O_{0.01}N_{15.99}$<br>Red: $Ba(Ti_{0.99}Mn_{0.01})F_6$ | 96.5% | 6800K + 0.002 | 87.8% |
| Comparative example 6 | 460 nm | Yellow: $(Y_{0.45}Gd_{0.45}Ce_{0.10})_3Al_5O_{12}$ | 100.0% | 6800K + 0.002 | 70.3% |
| Example 7 | 445 nm | Green: $2(Ba_{0.85}Sr_{0.10}Eu_{0.05})O \cdot SiO_2$<br>Red: $(K_{0.80}Na_{0.20})_2(Ti_{0.69}Ge_{0.30}Mn_{0.01})F_6$ | 96.5% | 6800K + 0.002 | 88.5% |
| Comparative example 7 | 445 nm | Yellow: $(Y_{0.35}Gd_{0.45}Ce_{0.20})_3Al_5O_{12}$ | 100.0% | 6800K + 0.002 | 70.4% |
| Example 8 | 470 nm | Green: $Eu_{0.005}Si_{11.70}Al_{0.30}O_{0.03}N_{15.97}$<br>Red: $Zn(Ti_{0.849}Sn_{0.150}Mn_{0.001})F_6$ | 96.3% | 9000K + 0.001 | 88.4% |
| Comparative example 8 | 470 nm | Yellow: $(Y_{0.40}Gd_{0.45}Ce_{0.15})_3Al_5O_{12}$ | 100.0% | 9000K + 0.001 | 70.2% |

Also Table 3 demonstrates that the light-emitting device of the present invention exhibits tremendously improved color gamut (NTSC ratio) compared with the conventional one, and has desired characteristics as a backlight for a medium- or small-sized LCD.

We claim:

1. A liquid crystal display incorporating a backlight source including a light-emitting device, the light-emitting device comprising:
   a light-emitting element emitting primary light, and a light converter absorbing a part of the primary light emitted from the light-emitting element and emitting secondary light having a longer wavelength than the primary light, said light converter including a green light-emitting phosphor and a red light-emitting phosphor,
   said green light-emitting phosphor including at least one selected from:
   a divalent europium-activated oxynitride phosphor which is β-type SiAlON, substantially represented by a general formula (A): $Eu_aSi_bAl_cO_dN_e$ (in said general formula (A), $0.005 \leq a \leq 0.4$, $b+c=12$, and $d+e=16$), and
   a divalent europium-activated silicate phosphor substantially represented by a general formula (B): $2(Ba_{1-f-g}MI_fEu_g)O \cdot SiO_2$ (in said general formula (B), MI represents at least one alkaline earth metal element selected from Mg, Ca and Sr, $0 < f \leq 0.55$, and $0.03 \leq g \leq 0.10$),
   said red light-emitting phosphor including at least one selected from:
   a tetravalent manganese-activated fluoro-tetravalent metalate phosphor substantially represented by a general formula (C): $MII_2(MIII_{1-h}Mn_h)F_6$ (in said general formula (C), MII represents at least one alkaline metal element selected from Li, Na, K, Rb and Cs, MIII represents at least one tetravalent metal element selected from Ge, Si, Sn, Ti and Zr, and $0.001 \leq h \leq 0.1$), and
   a tetravalent manganese-activated fluoro-tetravalent metalate phosphor substantially represented by a general formula (D): $MIV(MIII_{1-h}Mn_h)F_6$ (in said general formula (D), MIV represents at least one alkaline earth metal element selected from Mg, Ca, Sr, Ba and Zn, MIII represents at least one tetravalent metal element selected from Ge, Si, Sn, Ti and Zr, and $0.001 \leq h \leq 0.1$).

2. A liquid crystal display incorporating a backlight source including a light-emitting device, the light-emitting device comprising:
   a light-emitting element emitting primary light, and a light converter absorbing a part of the primary light emitted from the light-emitting element and emitting secondary light having a longer wavelength than the primary light, said light converter including a green light-emitting phosphor and a red light-emitting phosphor,
   said red light-emitting phosphor including at least one selected from:
   a tetravalent manganese-activated fluoro-tetravalent metalate phosphor substantially represented by a general formula (C): $MII_2(MIII_{1-h}Mn_h)F_6$ (in said general formula (C), MII represents at least one alkaline metal element selected from Li, Na, K, Rb and Cs, MIII represents at least one tetravalent metal element selected from Ge, Si, Sn, Ti and Zr, and $0.001 \leq h \leq 0.1$), and
   a tetravalent manganese-activated fluoro-tetravalent metalate phosphor substantially represented by a general formula (D): $MIV(MIII_{1-h}Mn_h)F_6$ (in said general formula (D), MIV represents at least one alkaline earth metal element selected from Mg, Ca, Sr, Ba and Zn, MIII represents at least one tetravalent metal element selected from Ge, Si, Sn, Ti and Zr, and $0.001 \leq h \leq 0.1$), and wherein the green light-emitting phosphor is mixed within the range of 5 to 70% of the green light-emitting phosphor and red light-emitting phosphor by weight ratio.

3. A liquid crystal display incorporating a backlight source including a light-emitting device, the light-emitting device comprising:
a light-emitting element emitting primary light, and a light converter absorbing a part of the primary light emitted from the light-emitting element and emitting secondary light having a longer wavelength than the primary light, said light converter including a green light-emitting phosphor and a red light-emitting phosphor,
said red light-emitting phosphor including at least one selected from:
a tetravalent manganese-activated fluoro-tetravalent metalate phosphor substantially represented by a general formula (C): $MII_2(MIII_{1-h}Mn_h)F_6$ (in said general formula (C), MII represents at least one alkaline metal element selected from Li, Na, K, Rb and Cs, MIII represents at least one tetravalent metal element selected from Ge, Si, Sn, Ti and Zr, and $0.001 \leq h \leq 0.1$), and
a tetravalent manganese-activated fluoro-tetravalent metalate phosphor substantially represented by a general formula (D): $MIV(MIII_{1-h}Mn_h)F_6$ (in said general formula (D), MIV represents at least one alkaline earth metal element selected from Mg, Ca, Sr, Ba and Zn, MIII represents at least one tetravalent metal element selected from Ge, Si, Sn, Ti and Zr, and $0.001 \leq h \leq 0.1$), and wherein
a mixing ratio of the red light-emitting phosphor is higher than that of the green light-emitting phosphor.

4. A liquid crystal display incorporating a backlight source including a light-emitting device, the light-emitting device comprising:
a light-emitting element that is a gallium nitride-based semiconductor emitting primary light having a peak wavelength of 430 to 480 nm, and a light converter including a first phosphor absorbing a part of the primary light emitted from the light-emitting element and emitting secondary light having a longer wavelength than the primary light, and a second phosphor emitting secondary light having a longer wavelength than the secondary light emitted from the first phosphor, wherein
said the second phosphor is a tetravalent manganese-activated fluoro-tetravalent metalate phosphor substantially represented by a general formula (C): $MII_2(MIII_{1-h}Mn_h)F_6$ (in said general formula (C), MII represents at least one alkaline metal element selected from Li, Na, K, Rb and Cs, MIII represents at least one tetravalent metal element selected from Ge, Si, Sn, Ti and Zr, and $0.001 \leq h \leq 0.1$), and wherein a mixing ratio of the second phosphor is higher than that of the first phosphor.

5. A liquid crystal display incorporating a backlight source including a light-emitting device, the light-emitting device comprising:
a light-emitting element for generating a primary light having a peak wavelength of 430 to 480 nm; and
a silicone resin covering said light-emitting element and including:
a first phosphor composed of manganese, potassium, fluorine and a tetravalent metal element selected from Ge, Si, Sn, Ti and Zr,
a second phosphor composed of europium, silicon, aluminum, oxygen and nitrogen, a weight ratio of the second phosphor relative to the first phosphor being 5 to 70%, and
an additive composed of silicon oxide.

6. The liquid crystal display of claim 5, wherein
said light-emitting element is located on a bottom of a recess of the light-emitting device, and
the first and second phosphor distributed in said silicone resin are provided in the recess.

7. A liquid crystal display incorporating a backlight source including a light-emitting device, the light-emitting device comprising:
a light-emitting element for generating a primary light having a peak wavelength of 430 to 480 nm; and
a silicone resin covering said light-emitting element and including:
a first phosphor composed of manganese, potassium, fluorine and a tetravalent metal element selected from Ge, Si, Sn, Ti and Zr,
a second phosphor composed of europium, silicon, aluminum, oxygen and nitrogen, an amount by weight of the second phosphor being smaller than that of the first phosphor, and
an additive composed of silicon oxide.

8. The liquid crystal display of claim 7, wherein a weight ratio of the second phosphor relative to the first phosphor is 15 to 45%.

9. The liquid crystal display of claim 8, wherein
said light-emitting element is located on a bottom of a recess of the light-emitting device, and
the first and second phosphor distributed in said silicone resin are provided in the recess.

\* \* \* \* \*